United States Patent [19]
Ueda et al.

[11] Patent Number: 5,515,008
[45] Date of Patent: May 7, 1996

[54] OUTPUT LEVEL AUTOMATIC CONTROL APPARATUS

[75] Inventors: Tomio Ueda, Kawasaki; Kenichi Sato, Sendai, both of Japan

[73] Assignee: Fujitsu Limited, Kawasaki, Japan

[21] Appl. No.: 362,006

[22] Filed: Dec. 22, 1994

[30] Foreign Application Priority Data

Jun. 27, 1994 [JP] Japan ................................. 6-145000

[51] Int. Cl.$^6$ ..................................................... H03G 3/30
[52] U.S. Cl. .......................... 330/280; 330/144; 330/279; 330/284; 455/126
[58] Field of Search ..................................... 330/138, 144, 330/145, 279, 280, 284; 455/126, 240.1, 242.1, 249.1

[56] References Cited

U.S. PATENT DOCUMENTS

| | | | |
|---|---|---|---|
| 4,499,430 | 2/1985 | Fujii | 330/279 |
| 4,553,105 | 11/1985 | Sasaki | 330/145 |
| 4,812,908 | 3/1989 | Frequin | 455/240.1 |

FOREIGN PATENT DOCUMENTS

63-81515  4/1988  Japan.
2-104131  4/1990  Japan.

*Primary Examiner*—James B. Mullins
*Attorney, Agent, or Firm*—Armstrong, Westerman, Hattori, McLeland & Naughton

[57] ABSTRACT

An output level automatic control apparatus suitable for use to keep a transmitted output level of a radio system constant has an objective to prevent an output level above a specified value from being transmitted if an input level abruptly becomes a normal level from a break state, and to stabilize the output level with a simple configuration. The output level automatic control apparatus includes a main amplifier output level feed-back control loop extending from an output side of a main amplifier to a variable attenuator, which main amplifier output level feed-back control loop includes an output level detecting means, a reference value setting means, and a control means controlling the variable attenuator on the basis of a result obtained by comparing a detected output of the main amplifier with a reference value. Said main amplifier output level feed-back loop becomes negative feed-back when the output level of said main amplifier is in the neighborhood of a set value, and becomes positive or zero feed-back when the output level of the main amplifier is smaller than a second set value that is smaller than said set value.

9 Claims, 12 Drawing Sheets

*PRIOR ART*

OUTPUT LEVEL AUTOMATIC CONTROL APPARATUS

BACKGROUND OF THE INVENTION

(1) Field of the Invention

The present invention relates to an output level automatic control (ALC) apparatus suitable for use to keep a transmitted output level in a transmitting board in a radio system such as a multiplex radio system or the like constant.

(2) Description of the Related Art

A digital multiplex radio system is, in general, required to keep an output level of a transmitter constant by absorbing fluctuations in output power due to temperature fluctuations, power-source voltage fluctuations, deterioration with age and the like. Therefore, the digital multiplex radio system is generally provided with an AIC apparatus where a part of a transmitted output is taken out by a directional coupler or the like to be detected and compared with a reference voltage to be amplified so that an attenuation quantity of a variable attenuator is regulated with that voltage. When an output level of the transmitter decreases, this ALC apparatus decreases an attenuation quantity of the variable attenuator, that is, a negative feed-back control is performed.

Figure 11:
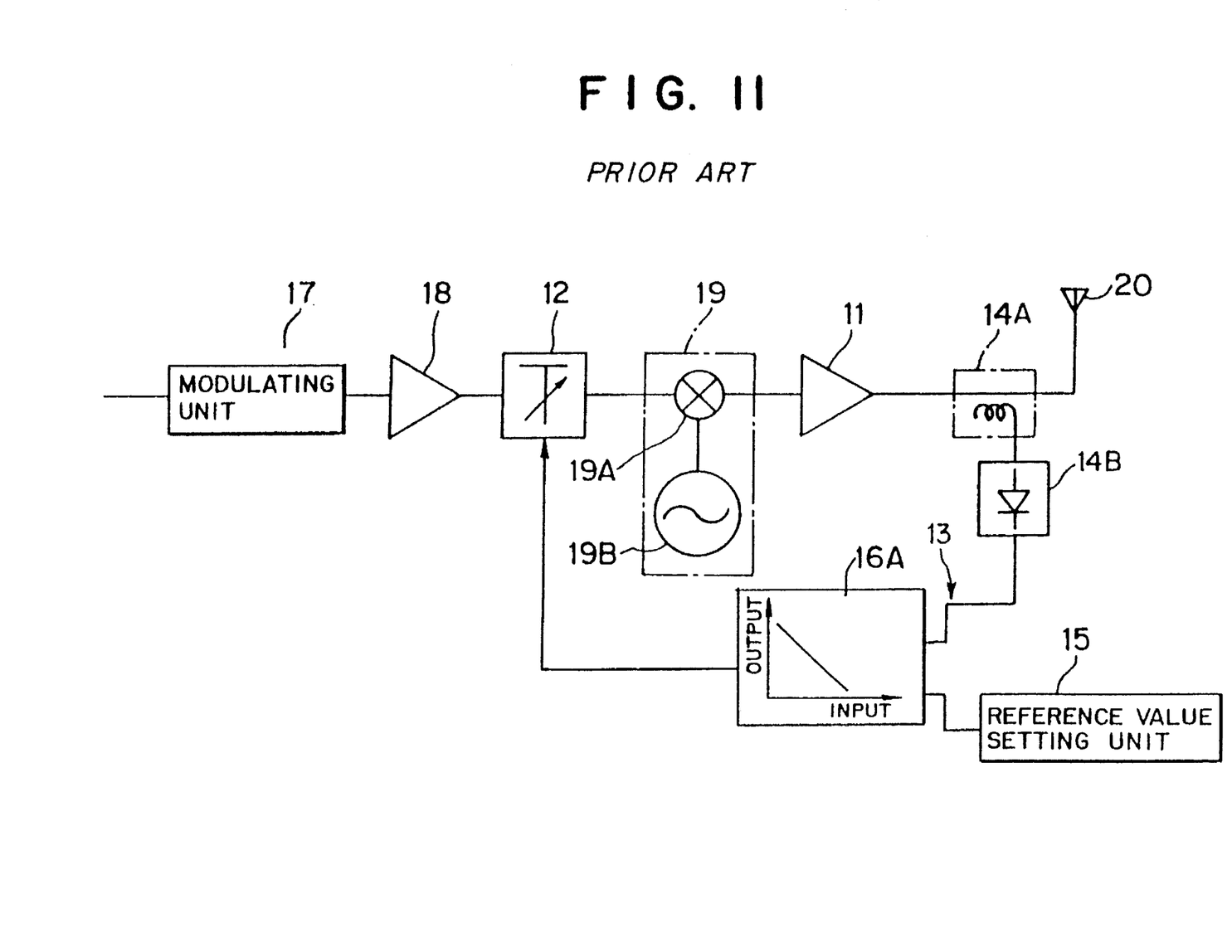
FIG. 11 is a block diagram of a conventional radio transmitting unit having an ALC apparatus.

FIG. 11 is a block diagram of a radio transmitting unit having an ALC apparatus. As shown in FIG. 11, the radio transmitting unit has a modulating unit 17, a preamplifier 18, a variable attenuator 12, an up-converter 19 (including a mixer 19A and a local oscillator 19B), a high-output amplifier (a main amplifier or a final stage amplifier) 11 and an antenna 20, in the order arranged from an input side of the radio transmitting unit on a transmission line of the same.

The ALC also has a feed-back control loop (a main amplifier output level feed-back control loop) 13 extending from an output side of the high-power amplifier 11 to the variable attenuator 12. The feed-back control loop 13 includes a directional coupler 14A and a detector 14B, as an output level detecting means, a reference value setting unit 15 setting a reference value and a control unit 16A.

The directional coupler 14A takes out an output level of the high-output amplifier 11 to a side of the feed-back control loop 13, while the detector 14B detects the output level of the high-output amplifier 11 taken out by the directional coupler 14A by detection.

The control unit 16A outputs a control signal used to control the output level of the high-output amplifier 11 to the variable attenuator 12 on the basis of a result obtained by comparing the output level of the high-output amplifier 11 detected by the detector 14B with the reference value set by the reference value setting unit 15, including a comparison amplifier.

Figure 13:
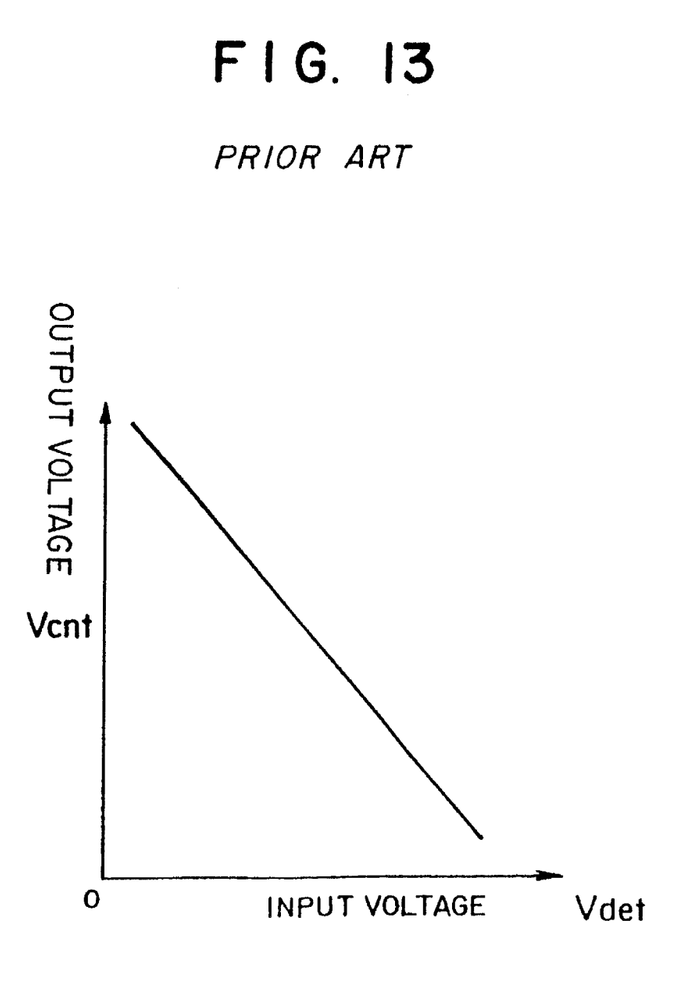
FIG. 13 is a graph showing a control characteristic of the conventional ALC apparatus.

The control unit 16A has a control characteristic shown in FIG. 13, where when the output level decreases, that is, an input voltage Vdet to the control unit 16A decreases, an output voltage (control voltage) Vcnt outputted from the control unit 16A is increased to decrease an attenuation quantity of the variable attenuator 12. In other words, the control unit 16A has a control characteristic to perform a negative feed-back control (that is, a characteristic monotonously descending towards the right) when the output level, that is, the input voltage Vdet decreases.

Such control characteristic of the control unit 16A is accomplished by that the variable attenuator 12 is so configured that the attenuation quantity of the variable attenuator 12 is decreased as the control voltage (output voltage) Vcnt is increased, and that the detector 14 is so configured that the detected voltage (input voltage) Vdet is decreased as the transmitted output level Po is decreased.

Figure 14:
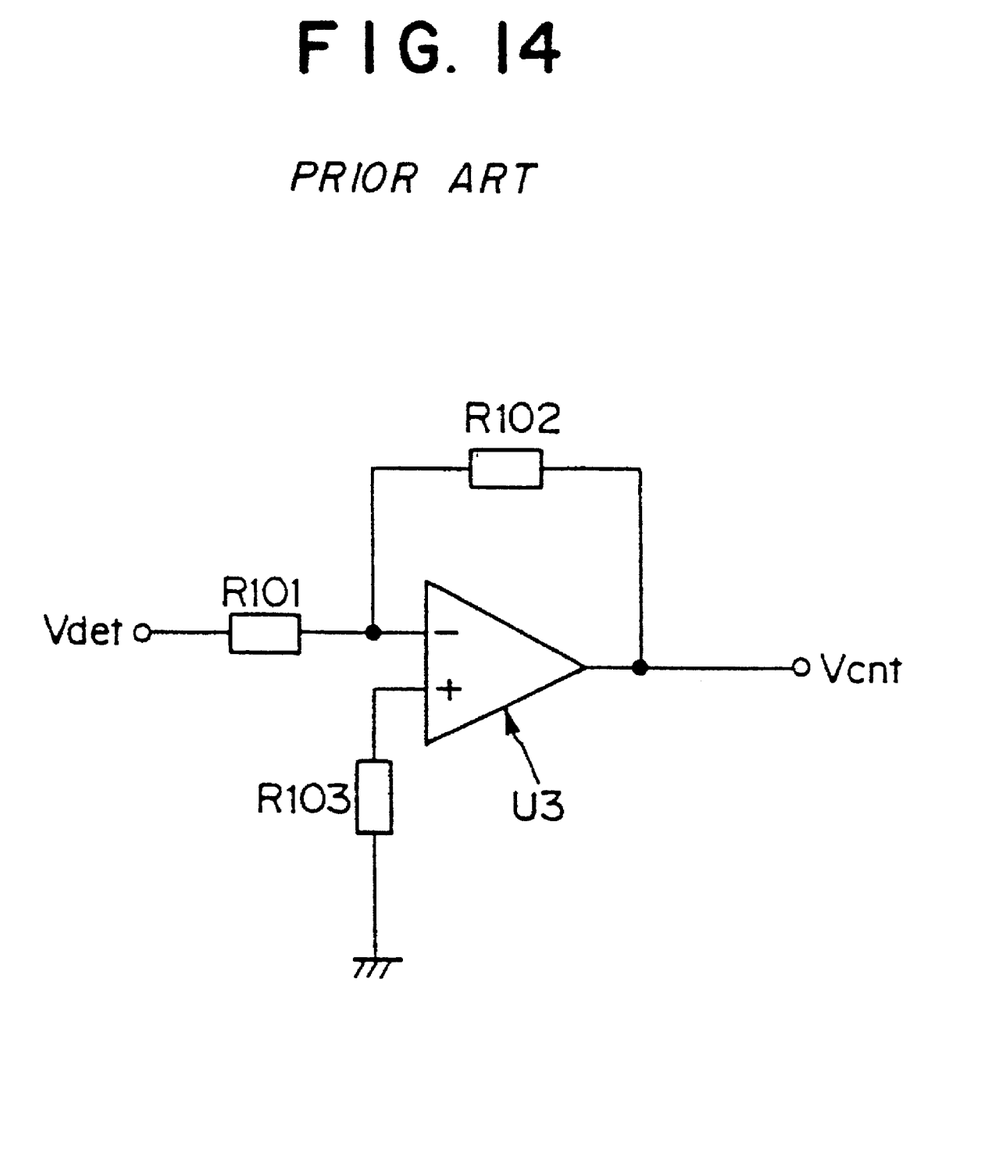
FIG. 14 shows an electric circuit of an essential portion of the conventional ALC apparatus.

Therefore, the control unit 16A may have an inverting amplifier U3 as shown in FIG. 14. The amplifier U3 is a linear amplifier, using an operational amplifier (an OP amplifier) or the like. The control voltage Vcnt and the detected voltage Vdet are equal to 0 V or more. Incidentally, R101, R102 and R103 shown in FIG. 14 are resistors.

In FIG. 11, when the transmitted output level Po decreases, the detected voltage Vdet decreases as well, and consequently the output voltage Vcnt of the control unit 16A increases. As a result, an attenuation quantity of the variable attenuator 12 decreases and the transmitter output level Po increases, becoming stable at a setting value.

Figure 12:
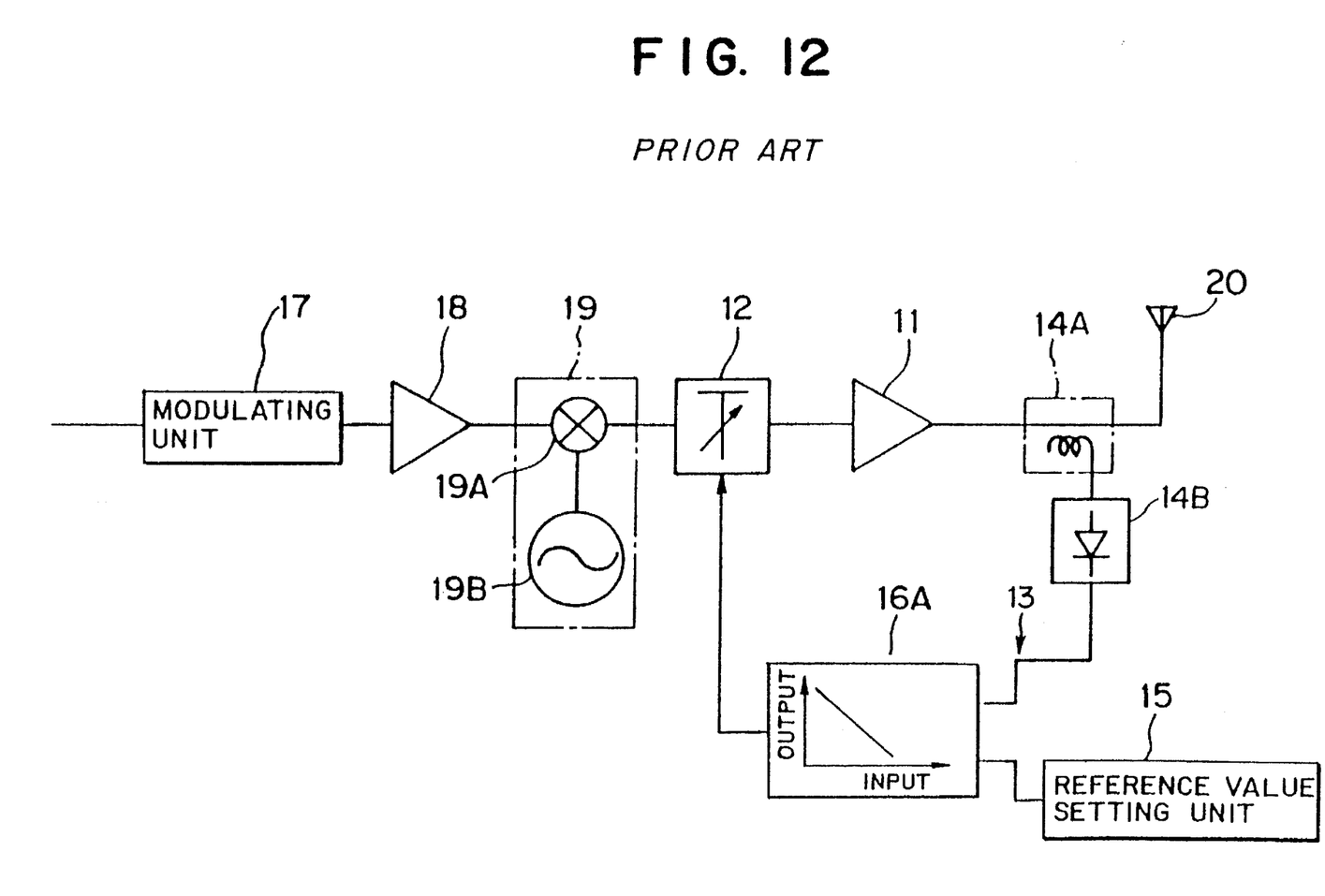
FIG. 12 is a block diagram of another conventional radio transmitting unit having an ALC apparatus.

FIG. 12 shows another proposal, where the variable attenuator 12 is interposed between the up-converter 19 and the high-output amplifier 11. In this case, the ALC operates in the same manner as the above-mentioned case shown in FIG. 11.

However, such conventional ALC apparatus so operate as to decrease an attenuation quantity of the variable attenuator 12 when an output level Po of the transmitter decreases. It means that when an input signal is not inputted to the transmitter, the transmitter operates at a maximum gain. If a signal at a level of a normal operational state is inputted under such condition, the output level Po exceeds a specified value until the ALC apparatus responds. In the worst case, the high-output amplifier 11 as a final stage amplifier operates in an overinput state, which might cause deterioration of amplifying elements such as an FET and the like forming the high-output amplifier 11.

It may be considered that the same phenomenon occurs upon on/off of a power source. Therefore, the same problem will arise in this case.

To overcome the above problem, there have been proposed an apparatus in which a control unit configured with a digital circuit including an A/D converter, a microprocessor, an A/D converter, etc. makes a judgement of "no output power" by watching an output level to keep an attenuation quantity of an variable attenuator in a state immediately before "no output power" [refer to Japanese Patent Laid-Open (Kokai) Publication No. 63-81515], or an apparatus in which a control unit makes a judgement of "no input power" by watching an input level so as to make a variable attenuator operate at a maximum attenuation quantity when there is "no input power" [refer to Japanese Patent Laid-Open (Kokai) Publication No. 2-1041311].

Above conventional ALC apparatus require a digital circuit to make a judgement of "no output power" or "no input power", an input level watching circuit and the like, causing an increase in size of the circuit or an increase in cost.

SUMMARY OF THE INVENTION

An object of the present invention is to provide an output level automatic control apparatus, which is capable of controlling an attenuation quantity of a variable attenuator by changing the feed-back control between a positive feed-back control state (including a zero feed-back control state) and a negative feed-back control state with a predetermined set value as a boundary without making a judgement such as "no output power" or "no input power", whereby an output level above a specified value may be prevented from being transmitted if an input level abruptly becomes a normal level from a break state and the output level may be stabilized with a simple configuration.

An output level automatic control apparatus according to this invention comprises a variable attenuator arranged on a side of an input of a main amplifier, a main amplifier output level feed-back control loop extending from a side of an output of said main amplifier to said variable attenuator, said main amplifier output level feed-back control loop comprising an output level detecting means detecting an output level of said main amplifier, a reference value setting means setting a reference value, a control means outputting a control signal controlling the output level of said main amplifier to said variable attenuator on the basis of a result obtained by comparing the output level of said main amplifier detected by said output level detecting means with the reference value set by said reference value setting means, said main amplifier output level feed-back control loop becoming negative feed-back when the output level of said main amplifier is in the neighbourhood of a set value and becoming positive feed-back or zero feed-back when the output level of said main amplifier is smaller than a second set value that is smaller than said set value.

With the above configuration, if the input level abruptly becomes a normal level from a break state, an output level may be prevented from being transmitted, and the output level may be stabilized.

It is also possible that said main amplifier output level feed-back control loop becomes negative feed-back when the output level of said main amplifier is equal to or larger than said second set value corresponding to an output level value of said main amplifier in the case of a minimum input level and a minimum gain or a maximum attenuation quantity, and becomes positive feed-back or zero feed-back when the output level of said main amplifier is smaller than said second set value. With such configuration, an output level above the specified value may be, similarly, prevented from being transmitted if the input level abruptly becomes a normal level from a break state, and the output level may be stabilized.

It is also possible that said control means is so configured as to attain a minimum gain or a maximum attenuation quantity when no input signal is inputted to said main amplifier. With this configuration, an output level above the specified value may be prevented from being transmitted if the input level abruptly becomes the normal level from the break state, and the output level may be stabilized.

It is also possible that said control means is so configured that a gain or an attenuation quantity when no input signal is inputted to said main amplifier is substantially equal to a gain or an attenuation quantity when the output level of said main amplifier is at said set value. With this configuration, a period required until the output level is stabilized from input of an input signal may be shortened.

It is also possible that said control means has a comparing means comparing the output level of said main amplifier detected by said output level detecting means with the reference value set by said reference value setting means, non-linearlity being provided to an input-output characteristic of said comparing means, thereby changing a control state between a positive feed-back control state or a zero feed-back control state and a negative feed-back control state with said second set value as a boundary. With this simple configuration, it is possible to prevent an output level above the specified value from being outputted if the input level abruptly becomes the normal level from the break state, and to stabilize the output level.

It is possible that said comparing means has an inverting amplifier having a range of an input voltage substantially equal to a range of an output voltage thereof, and a diode is so connected between an input of said inverting amplifier and an output of the same that the output voltage is substantially equal to the input voltage in a positive feed-back region. With such simple configuration, an output level above a specified value may be, similarly, prevented from being transmitted if the input level abruptly becomes the normal level from the break state, and the output level may be stabilized.

It is also possible tidal said comparing means has an inverting amplifier having a range of an input voltage substantially equal to a range of an output voltage thereof, and a noninverting amplifier arranged in a front stage of said inverting amplifier to prevent said inverting amplifier from being a load to said output level detecting means. With this configuration, it is possible to provide an output level automatic control apparatus of a high utility value in which an output level above a specified value is prevented from being transmitted if the input level abruptly becomes the normal level from the break state, and the output level is stabilized.

It is possible that said inverting amplifier is configured with an operational amplifier of an open collector output type and said noninverting amplifier is configured with an operational amplifier of a push-pull output type. With this configuration, it is possible to provide a practical circuit with a small number of elements.

It is also possible that both of said inverting amplifier and said noninverting amplifier are configured with operational amplifiers of a push-pull output type, or operational amplifiers of an open collector output type. If said noninverting amplifier and said inverting amplifier are configured with devices of the same type, it is possible to form the control means with a dual operational amplifier housed in one package, which brings a large advantage in the fabrication.

It is possible that said comparing means has an amplifier having an inverting input terminal and a noninverting input terminal, a first resistor is connected to said inverting input terminal of said amplifier, a second resistor is connected to said noninverting input terminal of said amplifier, a third resistor is connected between said inverting input terminal and an output terminal of said amplifier, a collector or drain of a transistor whose emitter or source is applied a voltage corresponding to said second set value is connected to said noninverting input terminal of said amplifier through a fourth resistor, and a fifth resistor is connected between a base or gate of said transistor and a side of an input of said second resistor, whereby said amplifier carries out noninverting amplification when an input signal is smaller than said second set value and carries out inverting amplification when the input signal is equal to or larger than said second set value. Further, it is possible that resistance values of said resistors are so set as to satisfy a relation of [(a resistance value of said third resistor)/(a resistance value of said first resistor)>(a resistance value of said fourth resistor)/(a resistance value of said second resistor)]. With this configuration, said amplifier carries out noninverting amplification when an input signal is smaller than said second set value and carries out noninverting amplification when the input signal is equal to or larger than said second set value. It is thus possible to, similarly, prevent an output level above a specified value from being transmitted if the input level abruptly becomes the normal level from a break state, and to stabilize the output level. This feature largely contributes the improvement in reliability.

Figure 1:
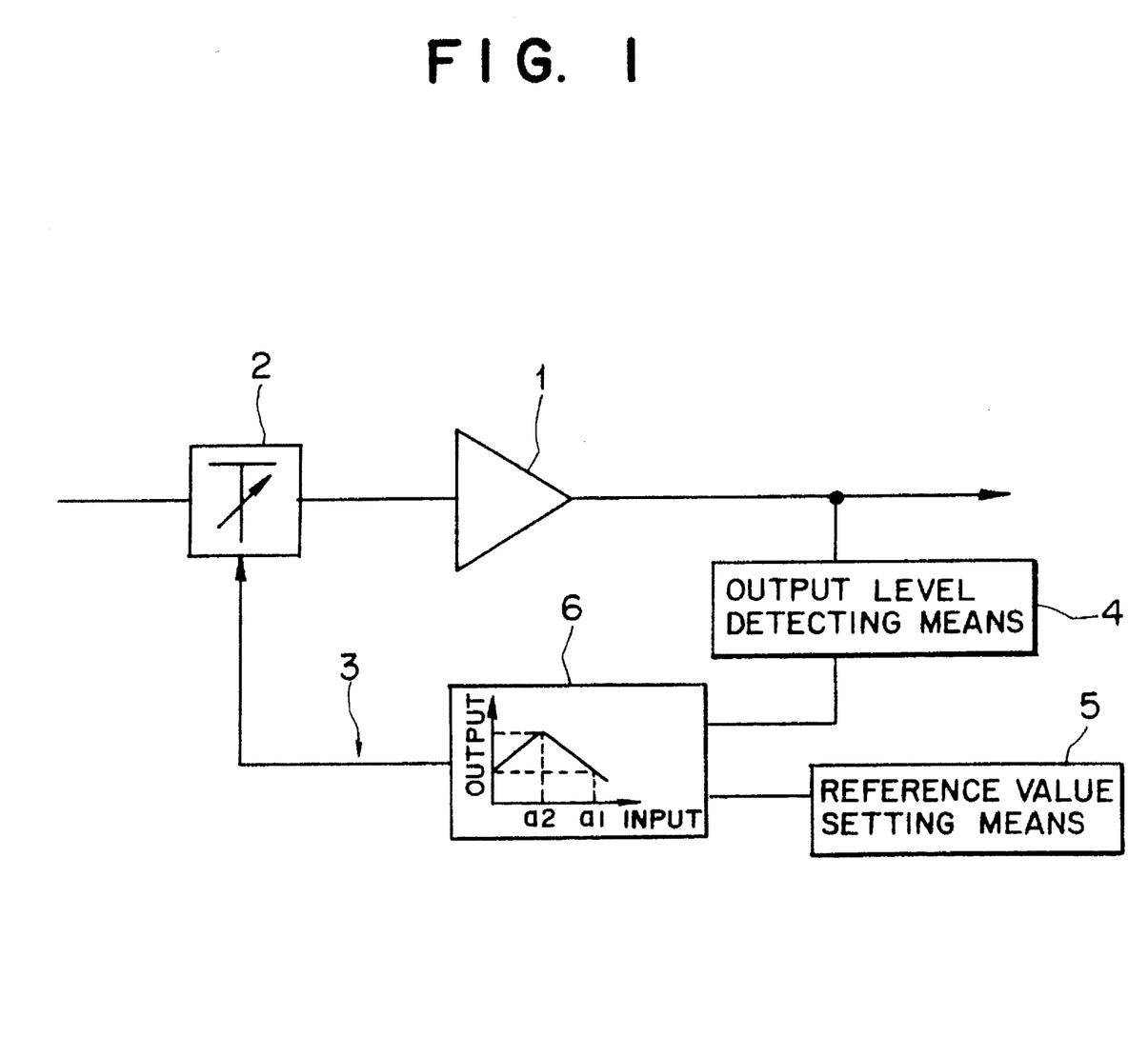
FIG. 1 is a block diagram illustrating an aspect of this invention.

DESCRIPTION OF THE PREFERRED EMBODIMENTS (a) Description of an aspect of the invention FIG. 1 is a block diagram illustrating an aspect of this invention. As shown in FIG. 1, there are provided a variable attenuator 2 arranged on an input side of a main amplifier 1 and a main amplifier output level feed-back control loop 3 extending from an output side of the main amplifier 1 to the variable attenuator 2.

The main amplifier output level feed-back control loop 3 has an output level detecting means 4, a reference value setting means 5 and a control means 6.

Here, the output level detecting means 4 detects an output level of the main amplifier 1, while the reference value setting means 5 sets a reference value.

The control means 6 outputs a control signal controlling an output level of the main amplifier 1 to the variable attenuator 2 on the basis of a result obtained by comparing an output level of the main amplifier 1 detected by the output level detecting means 4 with a reference value set by the reference value setting means 5.

The main amplifier output level feed-back control loop 3 is so configured as to perform negative feed-back in the neighbourhood of a set value a1 for an output level of the main amplifier 1, and perform positive feed-back or zero feed-back when the output level of the main amplifier 1 is smaller than a second set value a2 that is smaller than the set value a1.

Here, the negative feed-back means that when the input increases or decreases, the output decreases or increases inversely, the positive feed-back means that when the input increases or decreases, the output increases or decreases corresponding to the input, and the zero feed-back means that even if the input increases or decreases, the output is kept constant.

The control unit 6 arranged in the main amplifier output level feed-back control loop 3 outputs a control signal used to control an output level of the main amplifier 1 to the variable attenuator 2 on the basis of a result of comparison of the output level of the main amplifier 1 detected by the output level detecting means 4 and a reference value set by the reference value setting means 5, thereby controlling the output level of the main amplifier 1. The main amplifier output level feed-back control loop 3 performs the negative feed-back when an output level of the main amplifier i is in the neighbourhood of the set value a1, and performs the positive feed-back or the zero feedback when the output level of the main amplifier 1 is smaller than a second set value a2 that is smaller than the set value a1.

As above, if the input level abruptly becomes a normal level from a break state, an output level above a specified value may be prevented from being transmitted and the output level may be stabilized.

It is possible to so configure the main amplifier output level feed-back control loop 3 as to perform the negative feed-back when the output level of the main amplifier 1 is equal to or larger than the second set value 2a corresponding to an output level value of the main amplifier 1 in the case of a minimum input level and a minimum gain or a maximum attenuation quantity, and perform the positive feed-back or the zero feed-back when the output level of the main amplifier 1 is smaller than the second set value a2. With this configuration, if the input level abruptly becomes the normal level from the break state, it is possible to prevent the output level above the specified value from being transmitted and to stabilize the output level, as same as the above case.

The control means 6 may be so configured as to controllably attain the minimum gain or the maximum attenuation quantity when no input signal is inputted to the main amplifier 1. With this configuration, the output level above the specified value may also be prevented from being transmitted, and the output level may be stabilized.

It is also possible that the control unit 6 so controls that a gain or an attenuation quantity when no input signal is inputted to the main amplifier 1 is substantially equal to a gain or an attenuation quantity when the output level of the main amplifier 1 is at said set value. With this configuration, a period required until the output level is stabilized from input of the input signal may be shortened.

The control means 6 may have a comparing means comparing the output level of the main amplifier 1 detected by the output level detecting means 4 with the reference value set by the reference value setting means 5, and non-linearlity is provided to an input-output characteristic of the comparing means, thereby changing the control state between the positive feed-back control state or the zero feed-back control state and the negative control state with the second set value a2 as a boundary. With such simple configuration, the output level above the specified value may be prevented from being transmitted if the input level abruptly becomes the normal level from the break state and the output level may be stabilized.

The comparing means may have an inverting amplifier having a range of an input voltage substantially equal to a range of an output voltage thereof, and a diode connected between an input and an output of the inverting amplifier so that the output voltage becomes substantially equal to the input voltage in a positive feed-back region. With this simple configuration, the output level above the specified value may be, similarly, prevented from being transmitted if the input level abruptly becomes the normal level from the break state, and the output level may be stabilized.

The comparing means may, otherwise, have an inverting amplifier having a range of an input voltage substantially equal to a range of an output voltage thereof, and a noninverting amplifier arranged in a front stage of said inverting amplifier to prevent said inverting amplifier from being a load to said output level detecting means 4. With this configuration, it is possible to provide an output level automatic control apparatus of a high utility value, in which the output level above the specified value may be prevented from being transmitted if the input level abruptly becomes the normal level from the break state.

In the above case, it is possible to configure the inverting amplifier with an operational amplifier of an open collector output type, and the non-inverting amplifier with an operational amplifier of a push-pull output type. With this configuration, it is possible to accomplish a practical circuit with a small number of elements.

It is also possible that the inverting amplifier and the noninverting amplifier are configured with operational amplifiers of a push-pull output type, respectively. The inverting amplifier and the noninverting amplifier may, otherwise, be configured with operational amplifiers of an open collector output type, respectively. Such configuration of the inverting amplifier and the noninverting amplifier with devices of the same type allows use of a dual operational amplifier housed in one package to form the control means, which is a great advantage in the fabrication.

The comparing means may have an amplifier having an inverting input terminal and a noninverting amplifier, a first resistor may be connected to the inverting input terminal of the amplifier, a second resistor may be connected to the noninverting input terminal of the amplifier, a third resistor may be connected between the inverting input terminal and an output terminal of the amplifier, a collector or drain of a transistor whose emitter or source is applied a voltage corresponding to the second set value a2 may be connected to the noninverting input terminal of the amplifier through a fourth resistor, and a fifth resister may be connected between a base or gate of the transistor and an input side of the second resistor so that the amplifier performs noninverting amplification when an input signal is smaller than the second set value a2 and noninverting amplification when the input signal is equal to or larger than the second set value a2. In which case, resistance values of the resistors are so set to satisfy a relation of [(a resistance value of the third resistor)/(a resistance value of the first resistor)>(a resistance value of the fourth resistor)/(a resistance value of the second resistor)]. With the above configuration, the amplifier performs noninverting amplification when the input signal is smaller than the second set value and inverting amplification when the input signal is equal to or larger than the second set value. As same as the cases set forth hereinbefore, the output level above the specified value may be prevented from being transmitted if the input level abruptly becomes the normal level from the break state and the output level may be stabilized. This feature largely contributes to an improvement in reliability.

(b) Description of an embodiment of the invention

Figure 2:
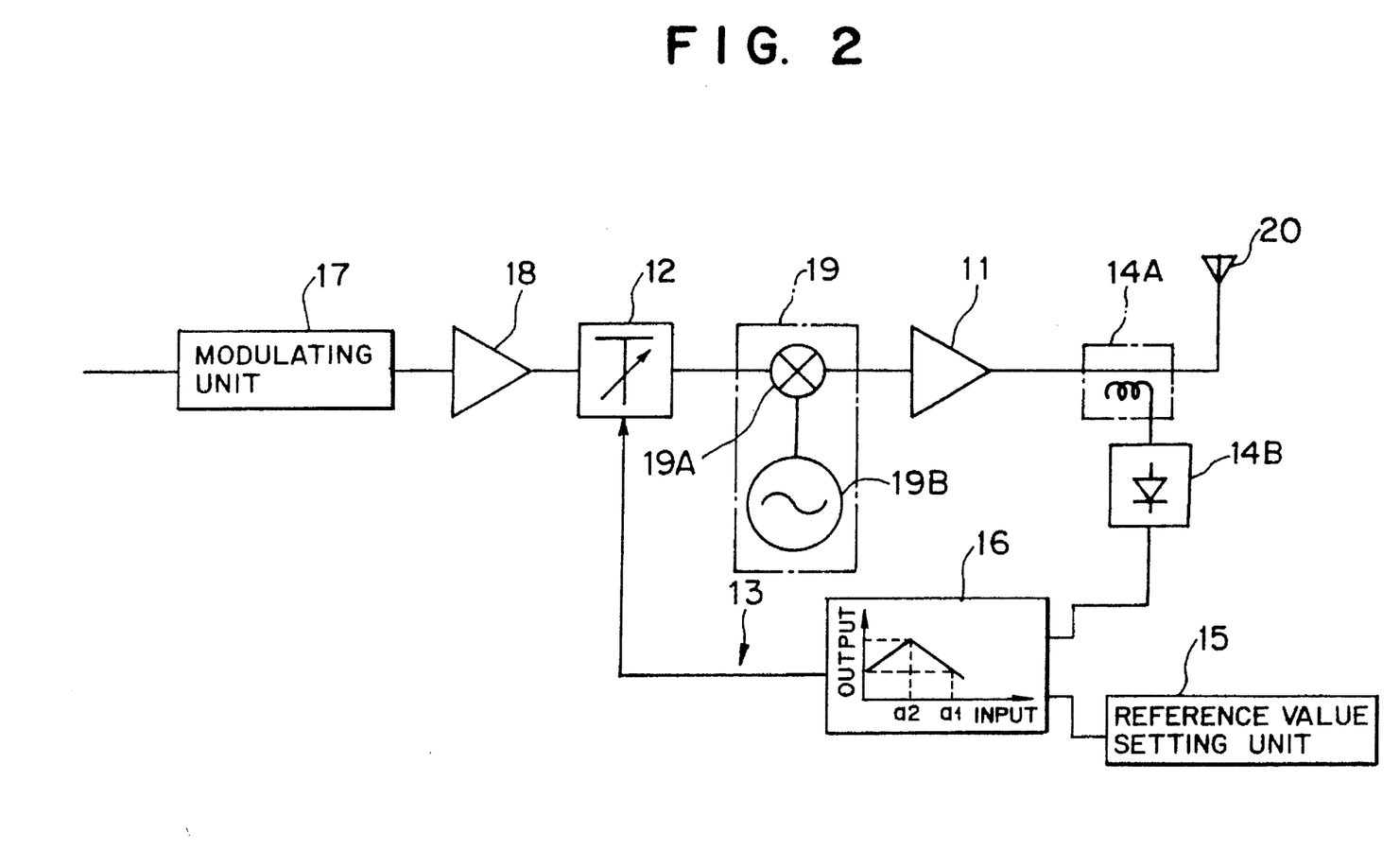
FIG. 2 is a block diagram of a radio transmitting unit having an ALC apparatus according to an embodiment of this invention.

FIG. 2 is a block diagram of a radio transmitting unit having an ALC apparatus as an embodiment according to this invention. As shown in FIG. 2, the radio transmitting unit has a modulating unit 17, a preamplifier 18, a variable attenuator 12, an up-converter 19 (including a mixer 19A and a local oscillator 19B), a high-output amplifier (a main amplifier) 11 and an antenna 20, in the order arranged from an input side of the radio transmitting unit on a transmitting line of the same.

In the ALC apparatus according to this embodiment, there is, likewise, provided a feed-back control loop (a main amplifier output level feed-back control loop) 13 extending from an output side of the high-output amplifier 11 to the variable attenuator 12. The feed-back control loop 13 includes a directional coupler 14A and a detector 14B, as an output level detecting means, a reference value setting unit (a reference value setting means) 15 setting a reference value and a control unit (a control means) 16.

Here, the directional coupler 14A is served to take out an output level of the high-output amplifier 11 to a side of the feed-back control loop 13, while the detector 14B is served to detect the output level of the high-output amplifier 11 taken out by the directional coupler 14A by detection. The reference value setting unit 15 sets a reference value (a reference voltage).

The control unit 16 outputs a control signal used to control the output level of the high-output amplifier 11 to the variable attenuator 12 on the basis of a result obtained by comparing the output level of the high-output amplifier 11 detected by the detector 14B with the reference value set by the reference value setting unit 15. The control unit 16 has such control characteristic as to be negative feed-back when the output level of the high-power amplifier 11 (that is, an input voltage to the control unit 11) is equal to or larger than the second set value a2, and positive feed-back when the output level of the high-output amplifier 11 is smaller than the second set value a2, as indicated by a thick line A in FIG. 9.

Figure 9:
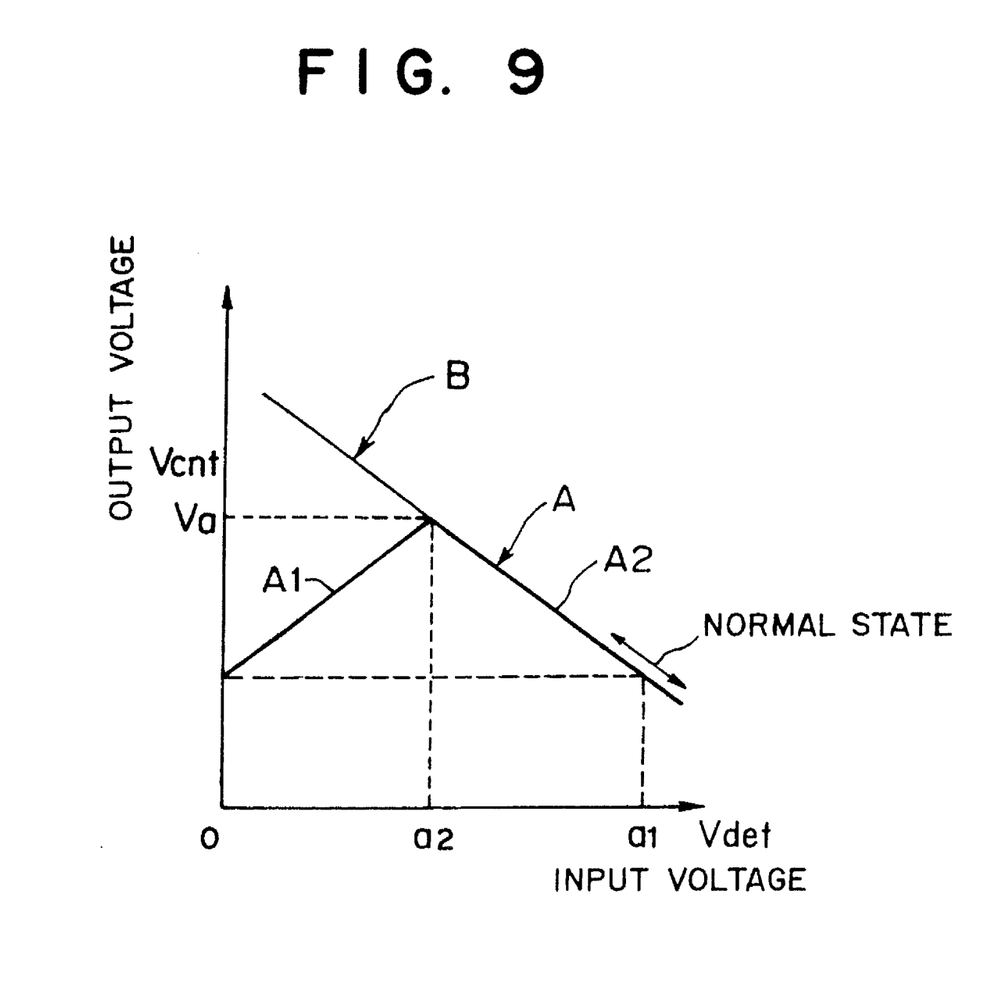
FIG. 9 is a graph showing a control characteristic of the ALC apparatus according to the embodiment of this invention.

More specifically, the control unit 16 has a non-linear control characteristic such as to be negative feed-back when the output level of the high-output amplifier 11 is equal to or larger than the second set value a2 corresponding to an output level value of the high-output amplifier 11 in the case of a minimum input level and a minimum gain or a maximum attenuation quantity, and be positive feed-back when the output level of the high-output amplifier 11 is smaller than the second set value a2.

For comparison, the control characteristic of an apparatus shown in FIG. 13 is indicated by a thin line B in FIG. 9, which is of only a negative feed-back, whose line thus descends to the right.

It can be seen that the control characteristic A is so set as to allow the minimum gain or the maximum attenuation quantity when no input signal is inputted to the high-output amplifier 11 (that is, an input voltage to the control unit 16 is zero).

Moreover, as seen from FIG. 9, a gain or an attenuation quantity when no input signal is inputted to the high-output amplifier 11 (that is, an input voltage to the control unit 16 is zero) is so set as to be substantially equal to a gain or an attenuation quantity when an output level of the high-output amplifier 11 is at the set value a1 (the set value a1 being a set value corresponding to a normal operational state when an input voltage to the control unit 16 is a1).

To satisfy the above conditions, a comparing means is provided in the control unit 16 to compare an output level of the high-output amplifier 11 detected by the detector 14B with a reference value set by the reference value setting means 15, and a non-linearlity is provided to the input-output characteristic A of the comparing means, whereby the control unit 16 may change the control state between a positive feed-back control state (referring to a characteristic A1) and a negative feed-back control state (referring to a characteristic A2) with the second set value a2 as a boundary.

Figure 3:
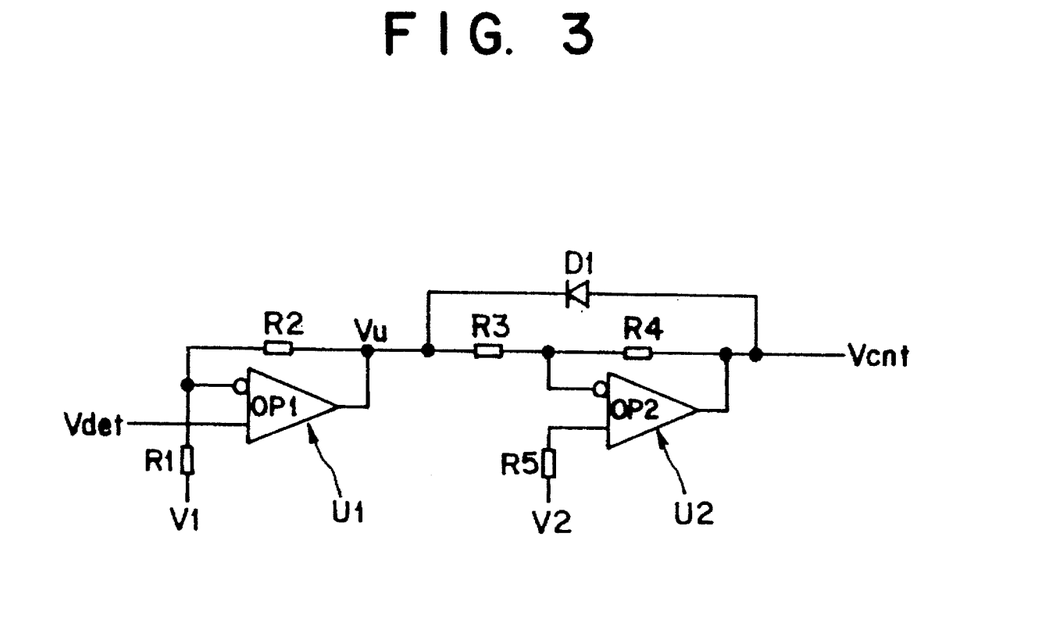
FIG. 3 shows an electric circuit of a portion of the radio transmitting unit according to the embodiment of this invention.

In practice, the control unit 16 is configured with a circuit shown in FIG. 3, for example. In the case shown in FIG. 3, a noninverting amplifier U1 is arranged in a front stage of the control unit 16 and an inverting amplifier U2 (having a function as an inverting/noninverting amplifier as described later) is arranged in a rear stage of the same.

In this case, the noninverting amplifier U1 is configured with an operational amplifier OP1 of a push-pull output type, and the inverting amplifier U2 is configured with an operational amplifier OP2 of an open collector output type.

The noninverting amplifier U1 is arranged in the front stage of the inverting amplifier U2, and a detection input Vdet is inputted to a noninverting input terminal of the operational amplifier OP1 of the noninverting amplifier U1, thereby preventing the noninverting amplifier U2 from being a load to the detector 14B.

In the non-inverting amplifier U2, an output from the noninverting amplifier U1 is inputted to a noninverting input terminal of the operational amplifier OP2 thereof, and a range of an input voltage of the inverting amplifier U2 is so set as to be substantially equal to a range of an output voltage of the same. Further, a diode D1 is connected between an input and an output of the inverting amplifier U2 so that the output voltage of the inverting amplifier U2 may be substantially equal to the input voltage of the same in a positive feed-back region.

Although an output voltage Vcnt of the inverting amplifier U2 exceeds an output voltage Vu of the noninverting amplifier UI in the case of Vu<Va (in the positive feed-back region), the output voltage Vcnt does not become Vcnt>Vu since the output voltage Vcnt is equalized to the output voltage Vu (Vcnt=Vu) by virtue of the diode D1 connected as above. As a result, the circuit becomes a noninverting amplifier of an apparent gain of 1 in the positive feed-back region, whose output voltage is thus substantially equal to the input voltage in the positive feed-back region. Here, Va is a control voltage corresponding to the second set value a2.

Resistors R1 and R2 are connected to the operational amplifier OP1 of the noninverting amplifier to adjust an entire loop gain. Resistors R3 to R5 are connected to the operational amplifier OP2 of the inverting amplifier U2. It is possible to adjust an inclination of the control characteristic A shown in FIG. 9 by adjusting values of the resistors R3 and R4. If a value of the resistor R3 is equalized to a value of the resistor R4, the control characteristic A becomes symmetrical with respect to the second set value a2 as a boundary.

Incidentally, V1 and V2 are reference voltages (reference values). The reference voltage V1 is connected to an inverting input terminal of the operational amplifier OP1 through the resistor R1, while the reference voltage V2 is connected to a noninverting input terminal of the operational amplifier OP2 through the resistor R5.

Therefore, with a circuit shown in FIG. 3, the control unit 16 may perform a negative feed-back control when an output level of the high-output amplifier 11 is equal to or larger than the second set value a2, and perform a positive feed-back control when the output level of the high-output amplifier 11 is smaller than the second set value a2, with a small number of elements. In other words, the control unit 16 functions as an inverting amplifier when the input voltage is equal to or larger than a2, but functions as a noninverting amplifier when the input voltage is smaller than a2. In consequence, when a transmitted output level Po is in the neighborhood of a set level, a negative feed-back control is performed, the transmitted output level Po is increased more and more so that an attenuation quantity of the variable attenuator 12 becomes the maximum.

When no input signal is inputted to the transmitter, an attenuation quantity of the variable attenuator 12 is the maximum. Accordingly, if a signal at a normal operational level is abruptly inputted, the transmitter output level Po does not exceed a specified value. At this time, since the detection voltage (the input voltage) Vdet is on the right side of a2 as shown in FIG. 9, the transmitter output level Po is gradually increased and stabilized at the set value.

An attenuation value of the variable attenuator 12 when no input signal is inputted the transmitter is adjusted to an attenuation quantity when the output level is at the set value so that it is possible to largely reduce a period required until the output level is stabilized from input of an input signal.

As above, according to this embodiment, it is possible to change the control state between the positive feed-back control state and the negative feed-back control state with a predetermined set value as a boundary so as to control an attenuation quantity of the variable attenuator 12 without a judgement such as "no output voltage" or "no input voltage" as having been made in the conventional apparatus. As a result, it is possible, with a simple configuration, to prevent an output level above a specified value from being transmitted if the input level abruptly becomes a normal level from a break state, and to stabilize the output level.

The noninverting amplifier U1 and the inverting amplifier U2 are preferably configured with devices of the same type. In which case, circuits shown in FIGS. 4 through 6 are possible.

Figure 4:
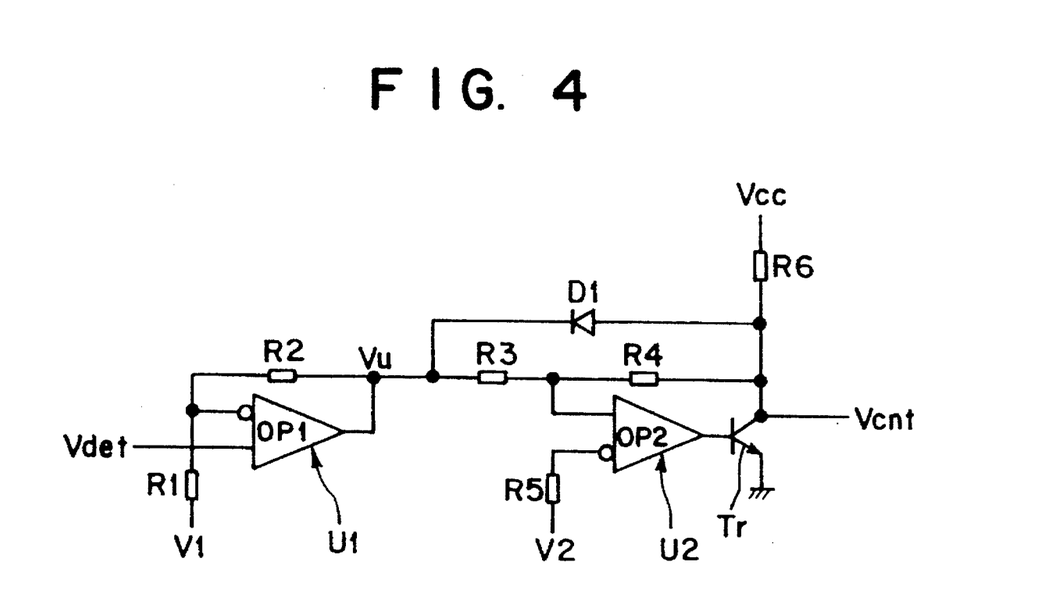
FIGS. 4 through 8 show another examples of a portion of the electric circuit of the radio transmitting unit according to other embodiments of this invention.

More specifically, in the circuit shown in FIG. 4, the noninverting amplifier U1 in the front stage and the inverting amplifier U2 in the rear stage are configured with operational amplifiers OP1 and OP2 of a push-pull output type, respectively. A transistor Tr is connected to an output side of the operational amplifier OP1 forming the noninverting amplifier U1, whereby the circuit operates as a noninverting amplifier as a whole. Incidentally, R6 is a pull-up resistor connected to a power source Vcc. In FIG. 4, like reference characters designate like or corresponding parts in FIG. 3.

Figure 5:
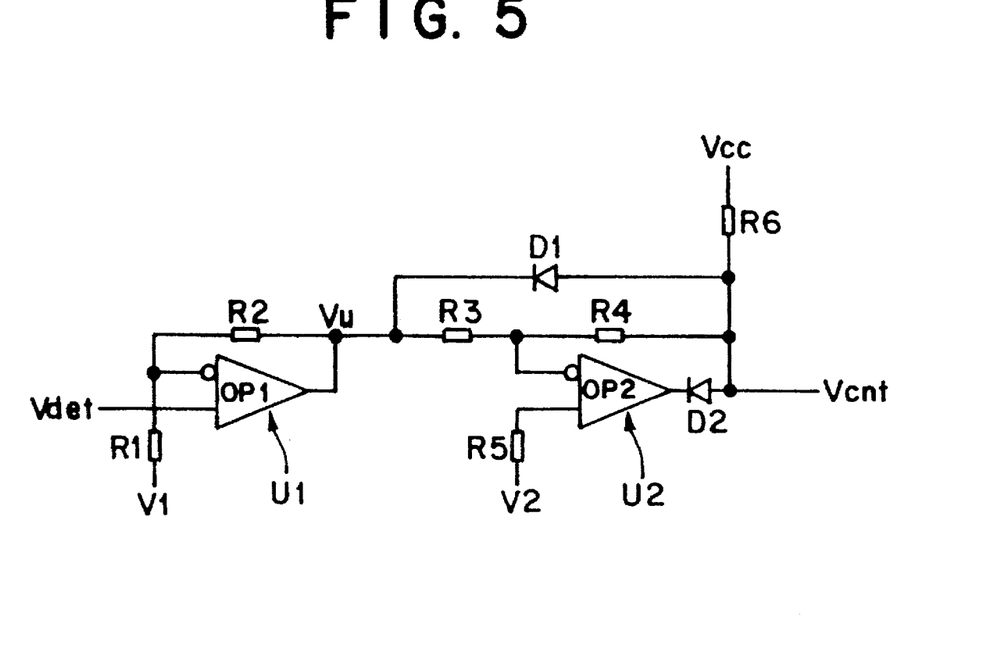

In FIG. 5, a noninverting amplifier U1 in the front stage and an inverting amplifier U2 in the rear stage are configured with operational amplifiers OP1 and OP2 of a push-pull output type, respectively. A diode D2 is connected to an output side of the operational amplifier OP1 forming the noninverting amplifier U1, whereby the circuit operates as a noninverting amplifier as a whole. Incidentally, like reference characters in FIG. 5 designate like or corresponding parts in FIGS. 3 and 4.

Figure 6:
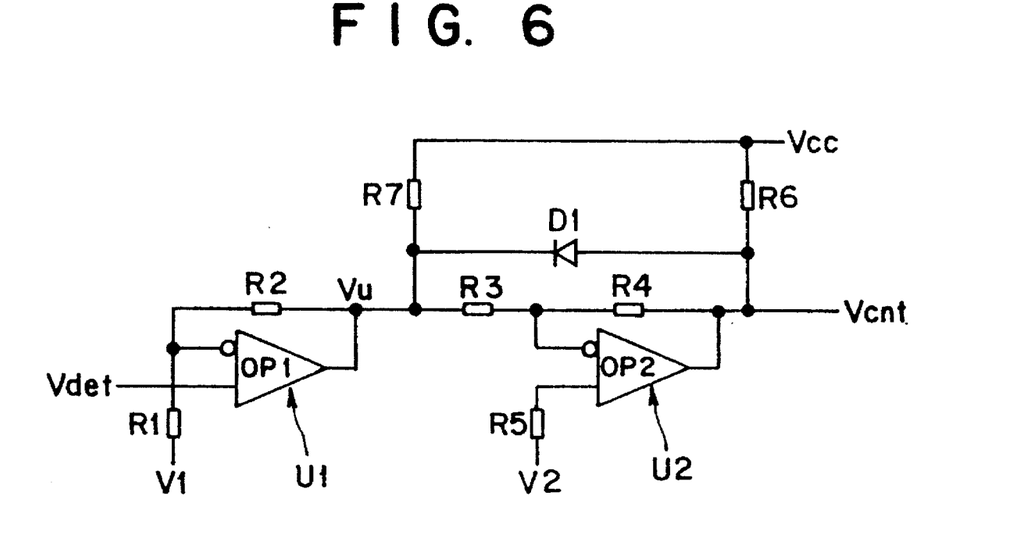

In FIG. 6, a noninverting amplifier U1 in the front stage and an inverting amplifier U2 in the rear stage are configured with operational amplifiers OP1 and OP2 of an open collector output type, respectively. Incidentally, R7 is a pull-up resistor connected to a power source Vcc. In FIG. 6, like reference characters designate like or corresponding parts in FIGS. 3, 4 and 5.

As above, configurations of the noninverting amplifier U1 and the inverting amplifier U2 with devices of the same type allows use of an dual operational amplifier housed in one package, bringing a large advantage in the fabrication. Circuits shown in FIGS. 4 through 6 may, of course, allow an operation as negative feed-back when an output level of the high-output amplifier 11 is equal to or larger than the second set value a2, and an operation as positive feed-back when the output level of the high-output amplifier 11 is smaller than the second set value a2. It is, thus, possible to change the control state between the positive feed-back control state and the negative feed-back control state with a predetermined value as a boundary so as to control an attenuation quantity of the variable attenuator 12, without a judgement such as "no output voltage" or "no input voltage" as having been made in the conventional apparatus. With a simple configuration, it is, of course, possible to prevent an output level above a specified value from being transmitted, and to stabilize the output level.

Figure 7:
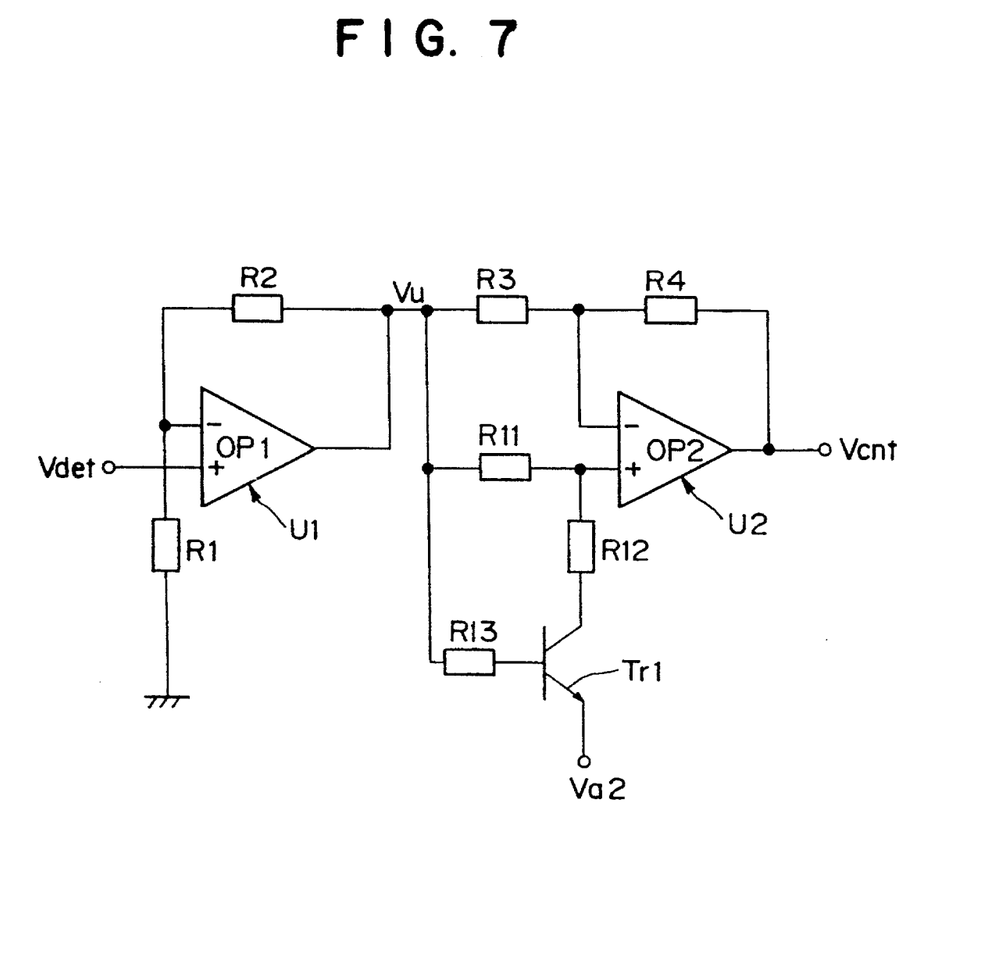

Otherwise, the control unit 16 may be configured with another circuit, for example, shown in FIG. 7. More specifically, there are provided a noninverting amplifier U1 in the front stage and an inverting amplifier U2 (having a function as an inverting/noninverting amplifier as described later) in the rear stage.

In the case shown in FIG. 7, the noninverting amplifier U1 is configured with an operational amplifier OP1 and the inverting amplifier U2 is configured with an operational amplifier OP2. Each of the operational amplifiers OP1,OP2 has an inverting input terminal and a noninverting input terminal.

Further, the noninverting amplifier U1 is arranged in the front stage of the inverting amplifier U2, as similar to that in FIG. 3, and a detection input Vdet is applied to the noninverting input terminal of the operational amplifier OP1 of the noninverting amplifier U1, thereby preventing the inverting amplifier U2 from being a load to a detector 14B.

A resistor R3 (a first resistor) is connected to the inverting input terminal of the operational amplifier OP2, a resistor R11 (a second resistor) is connected to the noninverting input terminal of the operational amplifier OP2, a resistor R4 (a third resistor) is connected between the inverting input terminal and an output terminal of the operational amplifier OP2, a collector of a transistor Tr1 whose emitter is applied a voltage Va2 corresponding to the second set value a2 is connected to the noninverting input terminal of the operational amplifier OP2 through a resistor R12 (a fourth resistor), and a resistor R13 (a fifth resistor) is connected between a base of the transistor Tr1 and an input of the the resistor R11.

Assuming that resistance values of the resistors R3, R4, R11 and R12 are R3, R4, R11 and R12, respectively, the resistance values of the respective resistors R3, R4, R11 and R12 are so set as to satisfy a relation of (R4/R3)>(R12/R11).

In consequence, the inverting amplifier U2 executes non-inverting amplification when an input signal is smaller than the second set value, and executes inverting amplification when the input signal is equal to or larger than the second set value.

Namely, if a voltage drop between the base and emitter of the transistor Tr1 is ignored, Vcnt−Va2= (((R4/R3)·R11−R12)/(R11+R12))(Vu−Va2) when Vu>Va2. If (R4/R3)>(R12/R11), the operational amplifier OP2 functions as an inverting amplifier. On the other hand, when Vu<Va2, Vcnt=Va2. The operational amplifier OP2, therefore, functions as a noninverting amplifier.

Meanwhile, a resistor R13 is served as a resistor limiting a base current of the transistor Tr1, preventing a voltage Vu from being clamped by a voltage Va2.

In this case, it is also possible that the circuit performs as a negative feed-back control when the output level of the high-output amplifier 11 is equal to or larger than the second set value a2, and performs a positive feed-back control when the output level of the high-output amplifier 11 is smaller than the second set value with a small number of elements, whereby a desired transmitted power control becomes feasible and the reliability may be largely improved.

Figure 8:
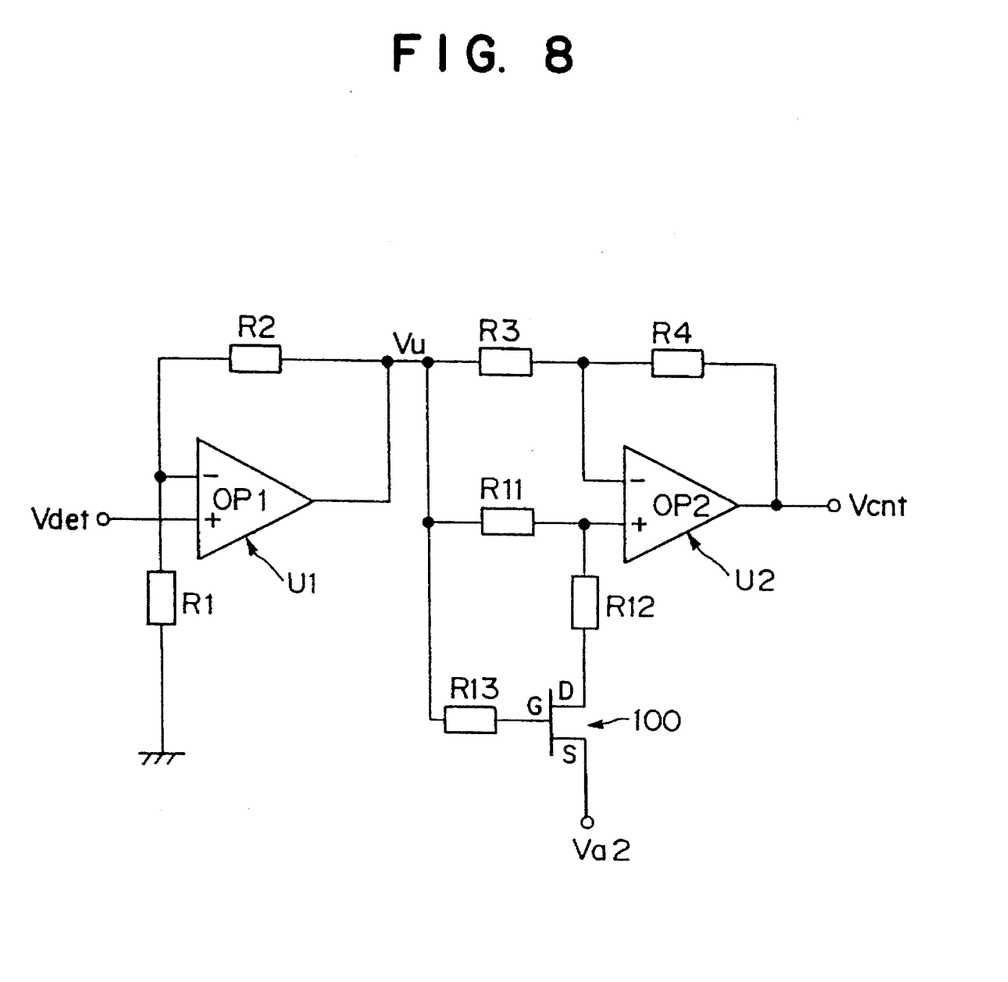

Instead of a bipolar transistor used as the transistor in the circuit shown in FIG. 7, it is possible to use a field-effect transistor (FET). In which case, as shown in FIG. 8, a drain of a field-effect transistor FET100 whose source is applied a voltage Va2 corresponding to the second set value a2 is connected to a noninverting input terminal of an operational amplifier OP2 through a resistor R12 (a fourth resistor), and a resistor R13 (a fifth resistor) is connected between a gate of the field-effect transistor FET100 and an input of a resistor 11. With this configuration, it is possible to accomplish the same operation and effect.

Figure 10:
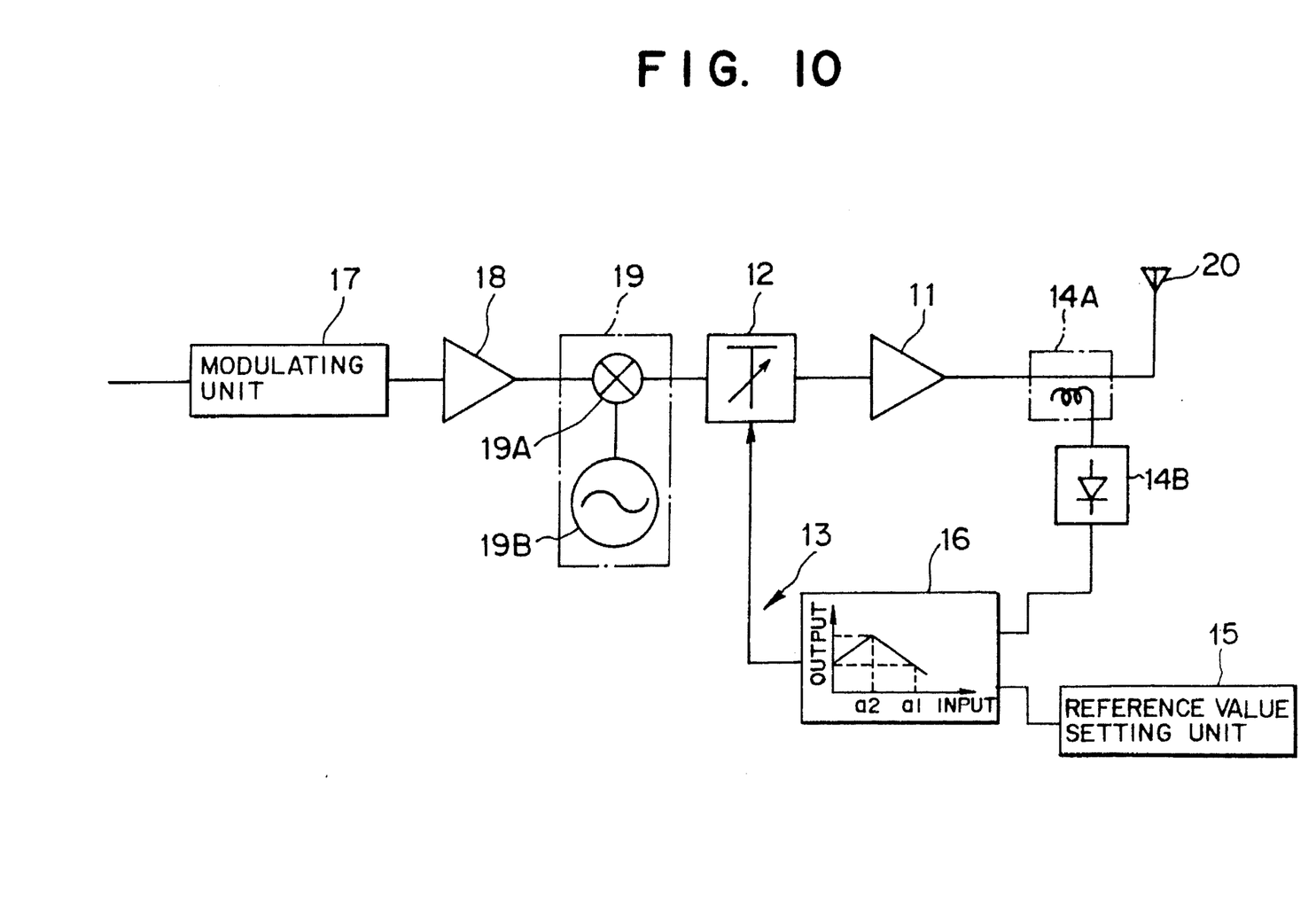
FIG. 10 is a block diagram showing another example of the radio transmitting unit having the ALC apparatus according to the embodiment of this invention.

The ALC circuit according to this invention is applicable to a radio transmitting unit in which a variable attenuator 12 is interposed between an up-converter 19 and a high-output amplifier 11, as shown in FIG. 10. In the case shown in FIG. 10, a control unit 16 of the ALC apparatus may be configured with one of the circuits shown in FIGS. 3 through 8. In a radio transmitting apparatus with the circuits shown in FIG. 10, it is also possible to prevent an output level above a specified value from being transmitted if an input level abruptly becomes a normal level from a break state, and to stabilize the output level.

It is not essential that an inclination of the characteristic A1 in the positive feed-back region is the same as that of the characteristic A2 in the negative feed-back region. An inclination of zero or positive is effective as same as this invention. If an inclination of the characteristic A1 is set to zero, it means that a zero feed-back control will be performed.

What is claimed is:

1. An output level automatic control apparatus comprising:

a variable attenuator arranged on a side of an input of a main amplifier;

a main amplifier output level feed-back control loop extending from a side of an output of said main amplifier to said variable attenuator;

said main amplifier output level feed-back control loop comprising an output level detecting means detecting an output level of said main amplifier;

a reference value setting means setting a reference value;

a control means outputting a control signal controlling the output level of said main amplifier to said variable attenuator on the basis of a result obtained by comparing the output level of said main amplifier detected by said output level detecting means with the reference value set by said reference value setting means;

said main amplifier output level feed-back control loop becoming negative feed-back when the output level of said main amplifier is in the neighborhood of a set value corresponding to a normal operation condition and becoming positive feed-back when the output level of said main amplifier is smaller than a second set value that is smaller than said set value; wherein a gain or an attenuation quantity at the time when no input signal is inputted to said main amplifier is set to be substantially equal to a gain or an attenuation quantity at the time when the output level of said main amplifier is at said set value corresponding to said normal operation condition.

2. An output level automatic control apparatus according to claim 1, wherein said main amplifier output level feed-back control loop becomes negative feed-back when the output level of said main amplifier is equal to or larger than said second set value corresponding to an output level value of said main amplifier in the case of a minimum input level and a minimum gain or a maximum attenuation quantity, and becomes positive feed-back when the output level of said main amplifier is smaller than said second set value.

3. An output level automatic control apparatus according to claim 1, wherein said control means so controls as to attain a minimum gain or a maximum attenuation quantity when no input signal is inputted to said main amplifier.

4. An output level automatic control apparatus according to claim 1, wherein said control means controls so that a gain or an attenuation quantity when no input signal is inputted to said main amplifier is substantially equal to a gain or an attenuation quantity when the output level of said main amplifier is at said set value corresponding to said normal operation condition.

5. An output level automatic control apparatus according to claim 1, wherein said control means has a comparing means comparing the output level of said main amplifier detected by said output level detecting means with the reference value set by said reference value setting means, non-linearly being provided to an input-output characteristic of said comparing means, thereby changing a control state between a positive feedback control state and a negative feed-back control state with said second set value as a boundary.

6. An output level automatic control apparatus according to claim 5, wherein said comparing means has an inverting amplifier having a range of an input voltage substantially equal to a range of an output voltage thereof, and a diode is so connected between an input of said inverting amplifier and an output of the same that the output voltage is substantially equal to the input voltage in a positive feed-back region.

7. An output level automatic control apparatus according to claim 6, wherein said comparing means has a noninverting amplifier arranged in a front stage of said inverting amplifier to prevent said inverting amplifier from being a load to said output level detecting means.

8. An output level automatic control apparatus according to claim 5, wherein said comparing means has an amplifier having an inverting input terminal and a noninverting input terminal, a first resistor is connected to said inverting input terminal of said amplifier, a second resistor is connected to said noninverting input terminal of said amplifier, a third resistor is connected between said inverting input terminal and an output terminal of said amplifier, a collector or drain of a transistor whose emitter or source is applied a voltage corresponding to said second set value is connected to said noninverting input terminal of said amplifier through a fourth resistor, and a fifth resistor is connected between a base or gate of said transistor and a side of an input of said second resistor, whereby said amplifier carries out noninverting amplification when an input signal is smaller than said second set value and carries out inverting amplification when the input signal is equal to or larger than said second set value.

9. An output level automatic control apparatus according to claim 8, wherein a resistance value of each of said resistors are set so as to satisfy a relation that a value obtained by dividing a resistance value of said third resistor by a resistance value of said first resistor is larger than a value obtained by dividing a resistance value of said fourth resistor by a resistance value of said second resistor.

* * * * *